United States Patent
Miller et al.

(10) Patent No.: US 8,816,691 B2
(45) Date of Patent: Aug. 26, 2014

(54) TRAILER CONNECTION CHECKING DEVICE AND METHOD

(75) Inventors: Richard Miller, Brentwood, TN (US); Brian Salazar, Chandler, AZ (US); Sumedh Mokashi, Farmington Hills, MI (US)

(73) Assignee: Nissan North America, Inc., Franklin, TN (US)

( * ) Notice: Subject to any disclaimer, the term of this patent is extended or adjusted under 35 U.S.C. 154(b) by 175 days.

(21) Appl. No.: 13/408,713

(22) Filed: Feb. 29, 2012

(65) Prior Publication Data

US 2013/0221970 A1    Aug. 29, 2013

(51) Int. Cl.
  *G01R 31/44*  (2006.01)
  *G01R 31/04*  (2006.01)

(52) U.S. Cl.
  USPC .......................................... 324/414; 324/538

(58) Field of Classification Search
  None
  See application file for complete search history.

(56) References Cited

U.S. PATENT DOCUMENTS

| | | | | |
|---|---|---|---|---|
| 4,547,722 A | * | 10/1985 | Sarlo | 324/504 |
| 4,866,390 A | * | 9/1989 | Butchko | 324/504 |
| 5,095,276 A | * | 3/1992 | Nepil | 324/504 |
| 5,498,910 A | * | 3/1996 | Hopkins et al. | 307/10.1 |
| 5,602,482 A | * | 2/1997 | Gutierrez | 324/504 |
| 5,604,439 A | * | 2/1997 | Walkington et al. | 324/504 |
| 5,725,228 A | * | 3/1998 | Livingston | 340/472 |
| 5,990,788 A | * | 11/1999 | Syracuse | 324/504 |
| 6,043,661 A | * | 3/2000 | Gutierrez | 324/504 |
| 6,081,189 A | * | 6/2000 | Warner | 324/504 |
| 6,100,801 A | * | 8/2000 | Plummer | 340/479 |
| 6,154,035 A | * | 11/2000 | Aguirre et al. | 324/504 |
| 7,339,465 B1 | * | 3/2008 | Cheng et al. | 340/514 |
| 7,345,579 B2 | * | 3/2008 | Nelson et al. | 340/431 |
| 8,031,061 B2 | * | 10/2011 | Kalous | 340/431 |
| 8,465,041 B2 | * | 6/2013 | Riibe | 280/422 |
| 2003/0052532 A1 | * | 3/2003 | Costello et al. | 303/7 |
| 2005/0258947 A1 | * | 11/2005 | Kunianski | 340/431 |
| 2008/0265904 A1 | * | 10/2008 | Biel | 324/504 |
| 2009/0072956 A1 | * | 3/2009 | Kalous | 340/431 |
| 2010/0237875 A1 | * | 9/2010 | Limcolioc | 324/504 |
| 2013/0221981 A1 | * | 8/2013 | Miller et al. | 324/538 |
| 2014/0015657 A1 | * | 1/2014 | Hanson et al. | 340/431 |

* cited by examiner

*Primary Examiner* — Jermele M Hollington
(74) *Attorney, Agent, or Firm* — Young, Basile, Hanlon & MacFarlane, P.C.

(57) ABSTRACT

Disclosed herein is a trailer light checking system for a vehicle for checking an electrical connection between the vehicle and a trailer comprising a plurality of exterior vehicle lights, the exterior vehicle lights including a left turn indicator light, a right turn indicator light and a brake indicator light, and further comprises a terminal connection configured to electrically connect each of the plurality of exterior vehicle lights to a respective trailer light. The trailer light checking system also comprises a vehicle controller having a trailer connection checking mode configured to check the terminal connection by simulating manual operation of each of the plurality of exterior vehicle lights according to a timed sequence, such that a respective trailer light will actuate in combination with the simulated manual operation of each of the plurality of exterior vehicle lights if the terminal connection and the respective trailer light are functioning correctly.

21 Claims, 8 Drawing Sheets

TRAILER CONNECTION CHECKING DEVICE AND METHOD

TECHNICAL FIELD

The embodiments disclosed herein generally relate to lighting systems for vehicles configurable for towing a trailer.

BACKGROUND

Vehicles are commonly configured for towing trailers by way of a hitch or other mechanical coupling. Vehicles are also commonly configured for electrical coupling to trailers. For example, a vehicle configured for towing a trailer may have a number of exterior vehicle lights, which can include indicator lights such as turn signals, brake lights and reverse lights, and other exterior lights such as taillights and running lights. The trailer may also have a number of similar exterior lights, some or all of which may correspond to an exterior light of the vehicle. A wiring harness or other electrical connection can be used to electrically couple a trailer light to a corresponding vehicle light, such that the trailer light is actuated in conjunction with actuation of the corresponding vehicle light.

In order to check the electrical connection between a vehicle and a trailer, it is typically necessary to actuate each of the vehicle lights. This procedure includes manual actuation of the vehicle lights from a position inside the vehicle. However, it is also necessary to confirm actuation of the trailer lights in conjunction with the actuation of their corresponding vehicle lights, which cannot be accomplished from a position inside the vehicle. Therefore, a second person is necessary to perform this procedure of checking the electrical connection between a vehicle and a trailer to confirm actuation of the trailer lights.

SUMMARY

Disclosed herein is an embodiment of a system and method for checking an electrical connection between a vehicle and a trailer. In one aspect, a trailer light checking system for a vehicle comprises a plurality of exterior vehicle lights, the exterior vehicle lights including a left turn indicator light, a right turn indicator light and a brake indicator light, and further comprises a terminal connection configured to electrically connect each of the plurality of exterior vehicle lights to a respective trailer light. The trailer light checking system also comprises a vehicle controller having a trailer connection checking mode configured to check the terminal connection by simulating manual operation of each of the plurality of exterior vehicle lights according to a timed sequence, such that a respective trailer light will actuate in combination with the simulated manual operation of each of the plurality of exterior vehicle lights if the terminal connection and the respective trailer light are functioning correctly.

In another aspect, a method of checking an electrical terminal connection between each of a plurality of exterior vehicle lights and a respective trailer light comprises simulating manual actuation of each of the plurality of exterior vehicle lights with a vehicle controller in a timed sequence according to a trailer connection checking mode, such that a respective trailer light will actuate in combination with the simulated manual operation of each of the plurality of exterior vehicle lights if the terminal connection and the respective trailer light are functioning correctly.

These and other aspects will be described in additional detail below.

BRIEF DESCRIPTION OF THE DRAWINGS

The various features, advantages and other uses of the present system and method will become more apparent by referring to the following detailed description and drawings in which.

DETAILED DESCRIPTION

Disclosed herein are embodiments of a system and method that obviates the need for multiple persons to perform a check of an electrical connection between a vehicle and a trailer.

Figure 1:
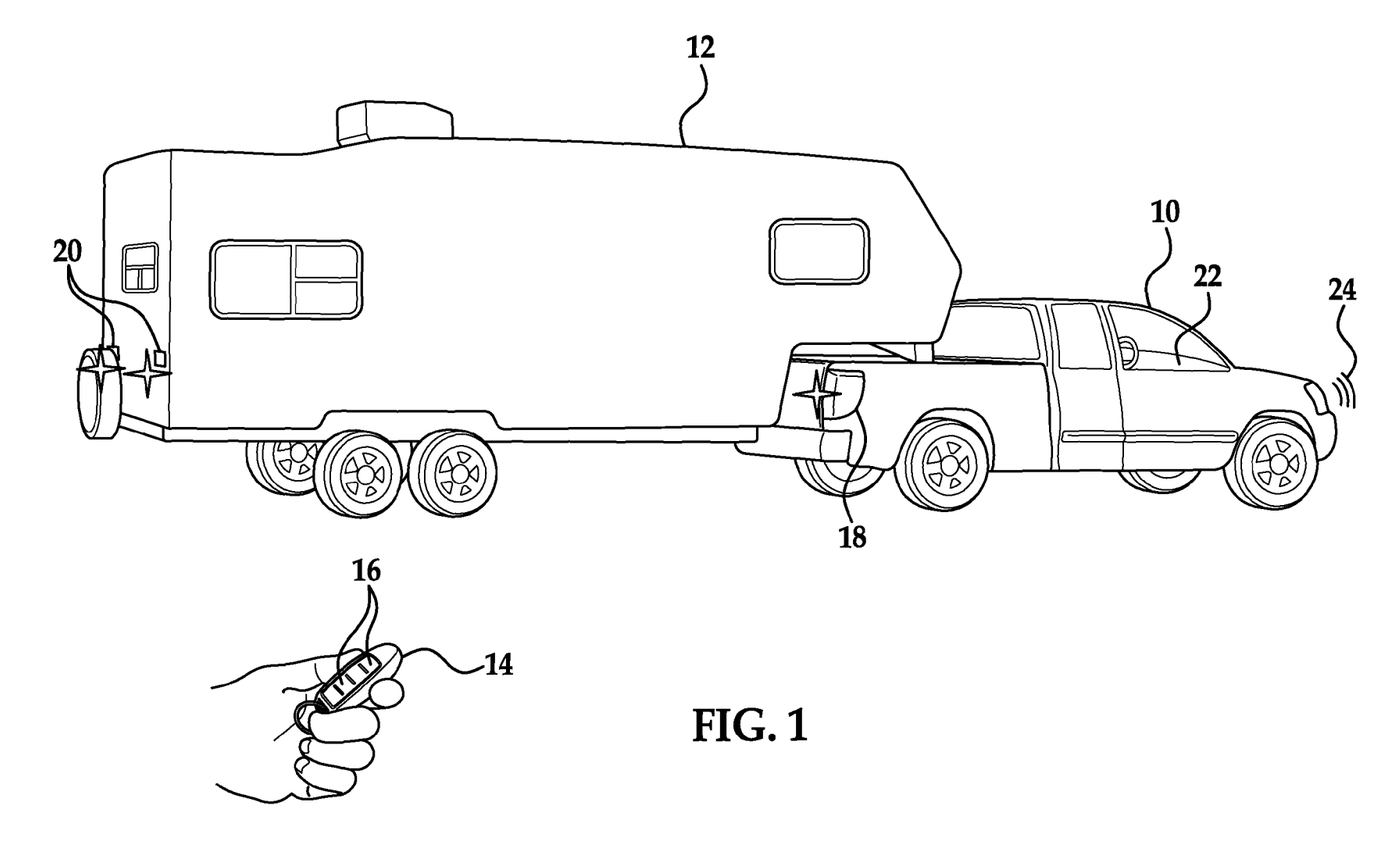
FIG. 1 is a perspective view of a trailer coupled to a vehicle and showing an example of an operator input device.

As shown in FIG. 1, a vehicle 10 can be configured for towing a trailer 12. The term "vehicle" is used herein generally to describe a vehicle or other road going or off-road motive device that can be configured for towing a trailer. Similarly, the term "trailer" is used herein generally to describe any vehicle that can be coupled to and towed by the vehicle 10. The trailer 12 is illustrated as a common recreational vehicle, but could also be a boat trailer, a utility trailer, a stock trailer or any other type of trailer. The vehicle 10 can be coupled to the trailer 12 by a coupling (not shown), such as a mechanical coupling. Common mechanical couplings include tow bars and hitches, but any other standard or custom coupling could be used.

The vehicle 10 can also be commutatively coupled to an operator input device 14. The vehicle 10 is responsive to the operator input device 14 to control various aspects of the vehicle 10. For example, the vehicle 10 can lock and unlock the vehicle, start the vehicle, unlatch its trunk or initiate a panic alarm in response to the operator input device 14. The operator input device 14 can be a device that is removable from the vehicle 10. As a non-limiting example, the operator input device 14 can be a key fob for the vehicle 10, as shown in FIG. 1. The operator input device 14 could also be a device included in the vehicle 10, such as a button included in the interior or on the exterior of the vehicle 10. The operator input device 14 is shown as having a plurality of inputs 16 for communicating with the vehicle 10.

Both the vehicle 10 and the trailer 12 can have lights for communicating driving intentions, safety lights, accessory lights and/or convenience lights, as non-limiting examples. The vehicle 10 can include a number of exterior vehicle lights 18, which as shown in FIG. 2B can include headlights, a left turn indicator light, a right turn indicator light, a brake indicator light, a backup indicator light, tail lights, or a running light, for example. Similarly, the trailer 12 can include a variety of trailer lights 20. Some or all of the trailer lights 20 can correspond to one or more of the exterior vehicle lights 18. By way of example, an exterior vehicle light 18 can be a right turn indicator light, and a trailer light 20 can correspond to the right turn indicator light such that the trailer light 20 is actuated in conjunction with the right turn indicator light. Some or all of the other exterior vehicle lights 18 can similarly correspond to respective trailer lights 20.

The vehicle 10 can include various other standard and/or accessory features. For example, an interior of the vehicle 10 can include a dash mounted instrument panel 22. The instrument panel 22 can house components configured for controlling aspects of the operation of the vehicle 10, and can house gauges, indicators and displays for displaying or indicating operating parameters of the vehicle 10 or other environmental information. The instrument panel 22 can further house components for producing alarms and alerts, such as audible signals and/or visual signals or displays, and can house other components for relaying information relating to the actual or desired functioning of the vehicle 10 to and from an operator of the vehicle 10. Although these components are described in a non-limiting example with reference to a dash mounted instrument panel 22, these components could additionally or alternatively be housed otherwise within the interior or on the exterior of the vehicle 10. For instance, components for producing alarms and alerts, such as audible signals and/or visual signals or displays could be included on the exterior of the vehicle 10. For example, the vehicle 10 can include a vehicle horn 24. The vehicle horn 24 can be a standard vehicle horn configured to provide an audible warning signal, although the vehicle horn 24 could be any other device configured to sound an audible signal perceivable from outside of the vehicle 10.

Figure 2A:
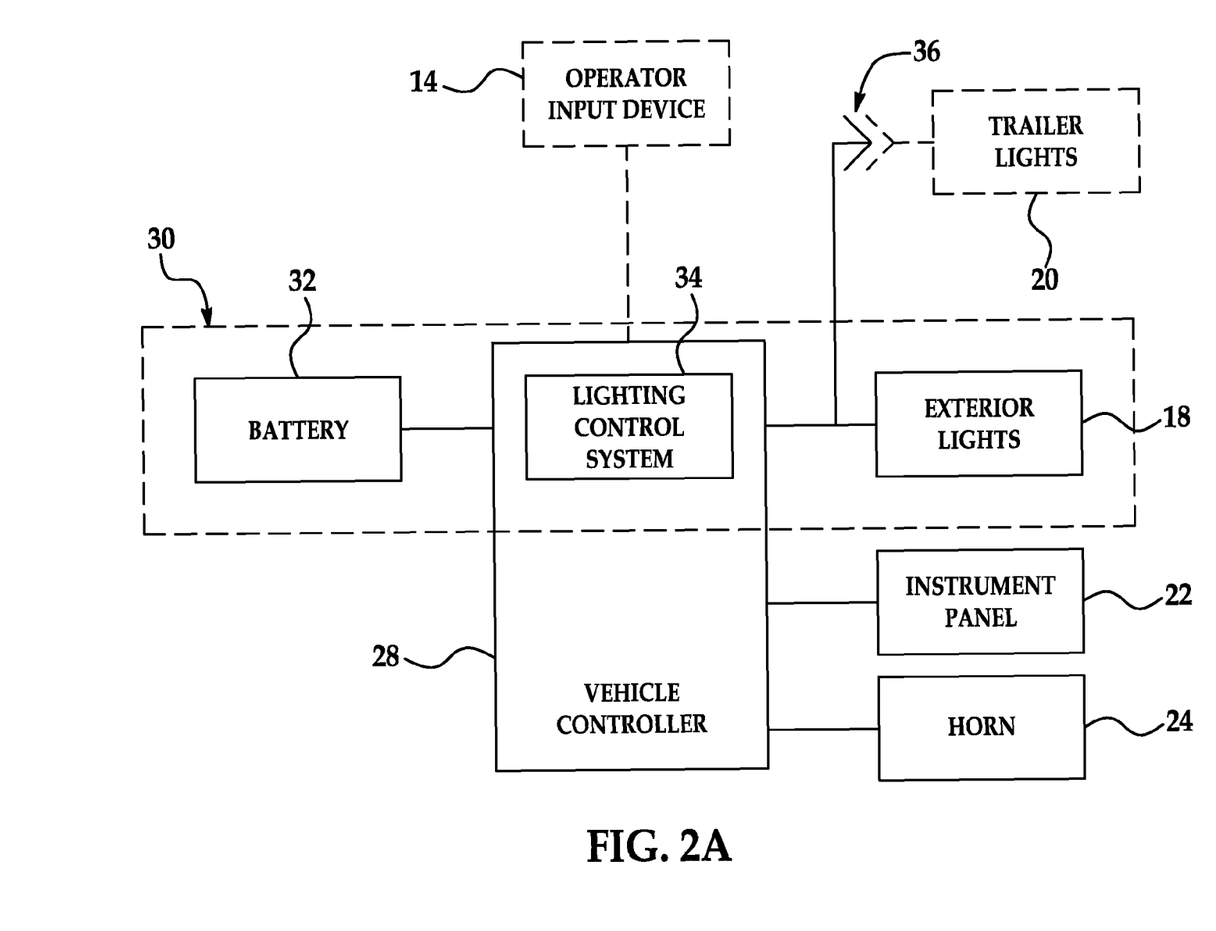
FIG. 2A is a system view showing a vehicle controller configured to control various functions of the vehicle in communication with the operator input device.
Figure 2B:
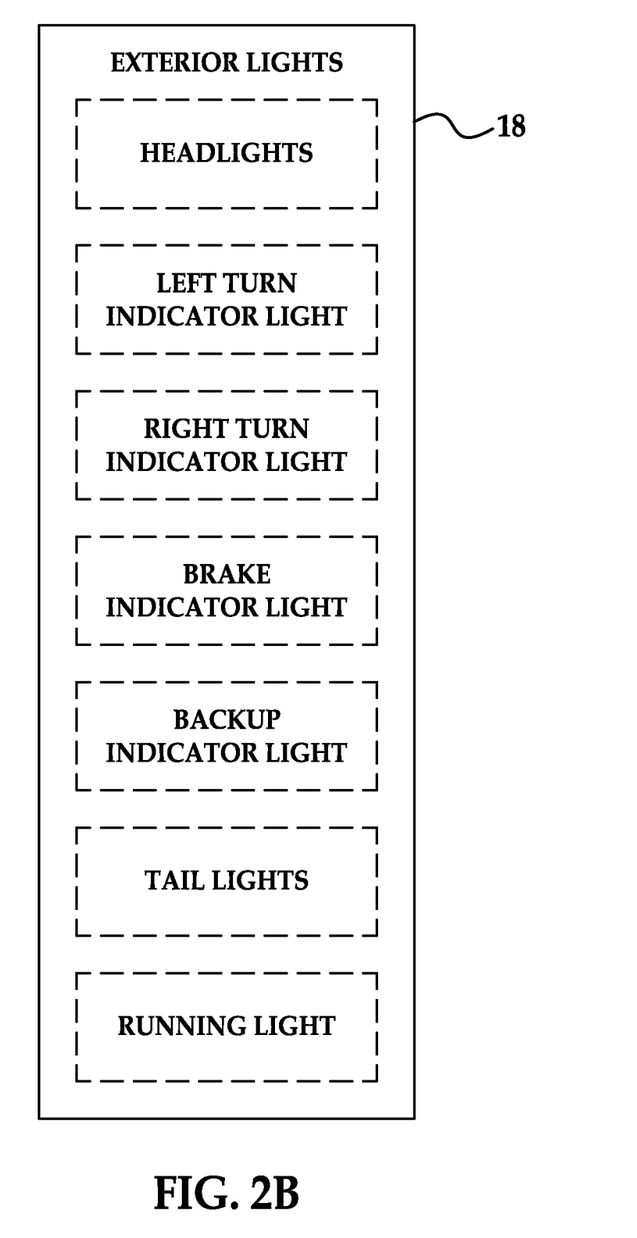
FIG. 2B is a system view showing examples of the vehicle's exterior vehicle lights.

As shown in FIG. 2A, the vehicle 10 can include a vehicle controller 28 for controlling electrical and/or electromechanical functions of the vehicle 10. The vehicle controller 28 could be a body control module (BCM) or other electronic control unit (ECU), such as a microcomputer including a random access memory (RAM), a read-only memory (ROM) and a central processing unit (CPU) in addition to various input and output connections. Generally, the control functions described herein can be implemented by one or more software programs stored in internal or external memory and are performed by execution by the CPU. However, some or all of the functions could also be implemented by hardware components. Although the vehicle controller 28 is shown and described as a single controller for performing multiple functions, the functions described herein could be implemented by separate controllers which collectively comprise the illustrated vehicle controller 28.

The vehicle controller 28 can be configured to control aspects of the operation of the vehicle 10, including operation of the exterior vehicle lights 18, the instrument panel 22 and the vehicle horn 24, for example. The vehicle 10 can include a power supply, such as a battery 32, for providing an electrical power suitable for actuating the exterior vehicle lights 18, operating the components of the instrument panel 22 and operating the vehicle horn 24. The exterior vehicle lights 18, the instrument panel 22 and the vehicle horn 24 can be electrically coupled to the battery 32 through mechanical or electrical switches, or, as illustrated, can be electrically coupled to the battery 32 by the vehicle controller 28. The vehicle controller 28 can directly supply electrical power to the exterior vehicle lights 18, the instrument panel 22 and the vehicle horn 24, or, for example, can indirectly cause the supply of electrical power through relays or through other mechanical or electrical switches known to those skilled in the art.

As shown, the exterior vehicle lights 18 can be included in a lighting system 30 of the vehicle 10. The lighting system 30 can include the battery 32, and the exterior vehicle lights 18 can be electrically coupled to the battery 32 by the vehicle controller 28 through a lighting control system 34 performed by the vehicle controller 28. The lighting control system 34 can be configured to control actuation of each of the exterior vehicle lights 18. The term "actuate" and its derivatives used to describe operation of the exterior vehicle lights 18 should be understood broadly as including continuous operation, intermittent or other non-continuous operation, or any other operation of the exterior vehicle lights 18. For example, an exterior vehicle light 18 be actuated steadily, or can be blinked, flashed, dimmed or amplified. In normal operation, the lighting control system 34 can control operation of the exterior vehicle lights 18 in accordance with a normal mode. The normal mode can include controlling actuation of one or more of the exterior vehicle lights 18 during normal driving operation of the vehicle 10 in response to, for example, an operator depressing a brake pedal, an operator working a turn signal switch, an operator working a hazard light switch, an operator placing the vehicle 10 in a reverse state, an operator or the lighting control system controlling a headlamp, an operator causing the vehicle 10 to lock or unlock, and/or an operator causing the vehicle 10 to start-up or shut-down, for example by working an ignition switch or a remote starting device.

Figure 3:
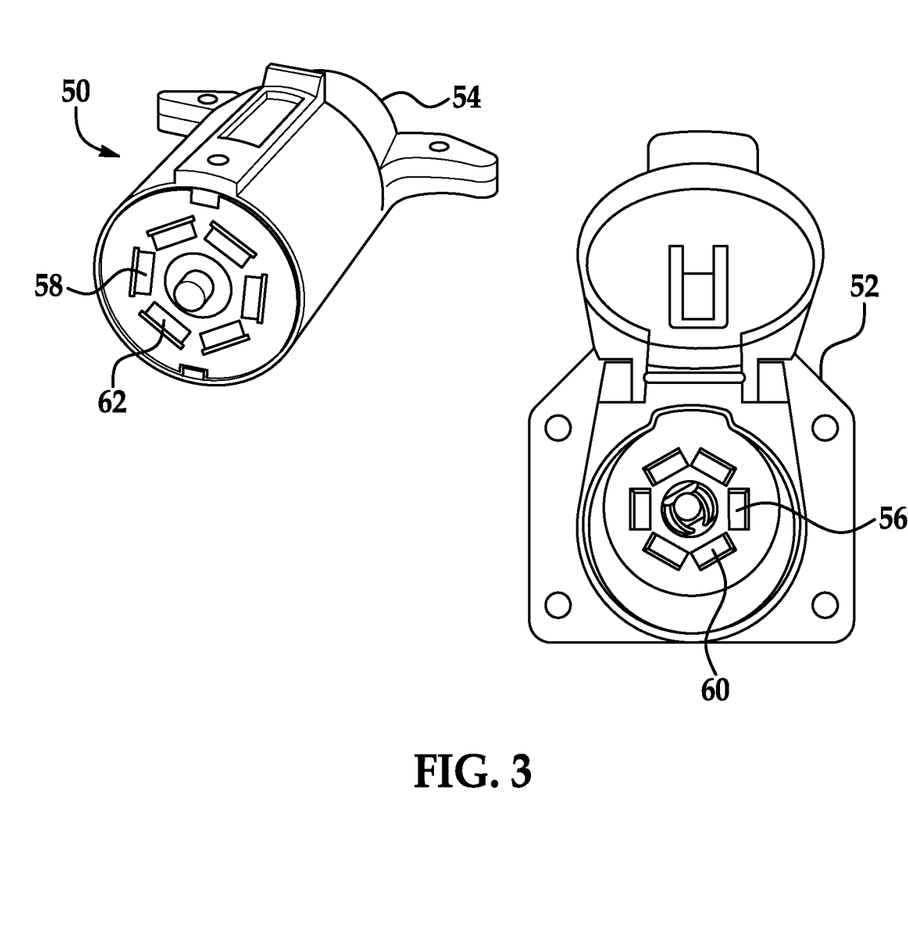
FIG. 3 is an example of an electrical connector configured for electrically coupling the vehicle to the trailer.

The lighting system 30 can also include a terminal connection 36, which can be configured to electrically connect and/or associate the exterior vehicle lights 18 to respective corresponding trailer lights 20. In one implementation, the terminal connection 36 can be accomplished with an electrical connector 50, as shown in FIG. 3. The illustrated electrical connector 50 includes a first end 52 configured for inclusion in the vehicle 10 and a second end 54 configured for inclusion in the trailer 12. The electrical connector 50 includes a number of terminals for providing a direct electrical connection between an exterior vehicle light 18 and a trailer light 20.

For example, a terminal 56 of the first end 52 can be wired in parallel to an electrical supply line for conveying an electrical power used to actuate a right turn indicator light of the vehicle 10. A respective terminal 58 of the second end 54 can, in turn, be electrically connected to a corresponding trailer light 20, such that a portion of the electrical power used actuate the right turn indicator light is diverted through the terminals 56 and 58 and supplied to the corresponding trailer light 20 in conjunction with the actuation of the right turn indicator light. Similarly, a terminal 60 of the first end 52 can be wired in parallel to an electrical supply line for conveying an electrical power used to actuate a brake indicator light of the vehicle 10. A respective terminal 62 of the second end 54 can, in turn, be electrically connected to a corresponding trailer light 20, such that a portion of the electrical power used to actuate the brake indicator light is diverted through the terminals 60 and 62 and supplied to the corresponding trailer light 20 in conjunction with the actuation of the brake indicator light. In this manner, the vehicle controller 28 including the lighting control system 34 can be electrically coupled to terminals 56, 60 of the first end 52, with each of the terminals 56, 60 associated with an exterior vehicle light 18 and a corresponding trailer light 20. By controlling actuation of an exterior vehicle light 18, the vehicle controller 28 can cause an electrical power to be supplied to the terminal, in addition to being supplied to the exterior vehicle light 18. When the first end 52 is coupled to the second end 54, the electrical power is also supplied to the terminals 58, 62 to actuate respective corresponding trailer lights 20.

In the illustrated implementation of a terminal connection 36, the electrical connector 50 is a standard 7-way trailer connector, although other standard trailer connectors can be used, such as a standard 4-way trailer connector, a standard 5-way trailer connector or a standard 6-way trailer connector, for example. In these or similar electrical connectors 50, not all of the terminals need be directly electrically connect to an exterior vehicle light 18. For example, terminals could also be used to supply a power or ground connection between the vehicle 10 and the trailer 12, or could be used to communicate control signals. As an alternative to or in addition to the illustrated electrical connector 50, a non-standard, custom or proprietary electrical connector could be used to implement the terminal connection 36.

The above description of an implementation of the terminal connection 36 using an electrical connector 50 is described for illustration only. Although the illustrated electrical connector 50 is configured to provide a direct electrical connection between an exterior vehicle light 18 and a respective trailer light 20, other implementations of a terminal connection 36 known to those skilled in the art could be used to electrically connect and/or associate the exterior vehicle lights 18 to respective corresponding trailer lights 20. For example, the vehicle controller 28 including the lighting control system 34 could provide for conveyance of an electrical power to a terminal connection 36 separate from the electrical power supplied to exterior vehicle lights 18. Alternatively, vehicle controller 28 could provide control signals to a terminal connection 36 for instructing another lighting control system, such as a lighting control system included in the trailer 12, to actuate the trailer lights 20 in conjunction with respective corresponding exterior vehicle lights 18.

When one or more trailer lights 20 of a trailer 12 are electrically coupled to respective corresponding exterior vehicle lights 18 of a typical vehicle 10, correct functioning of the terminal connection 36 must be checked. Typically, this procedure requires manual actuation of the exterior vehicle lights 18. For example, a right turn indicator light could be actuated in response to an operator working a turn signal switch, or a brake indicator light could be actuated in response to an operator depressing a brake pedal. These manual operations must be accomplished from a position inside the vehicle 10. However, in order to confirm correct functionality of both the terminal connection 36 and trailer lights 20, the procedure also requires visual confirmation of corresponding actuation of the respective corresponding trailer lights 20, which cannot be accomplished from a position inside the vehicle 10. It can be seen that the typical procedure of checking the terminal connection 36 requires a person in addition to the person confirming actuation of the trailer lights 20.

Figure 4:
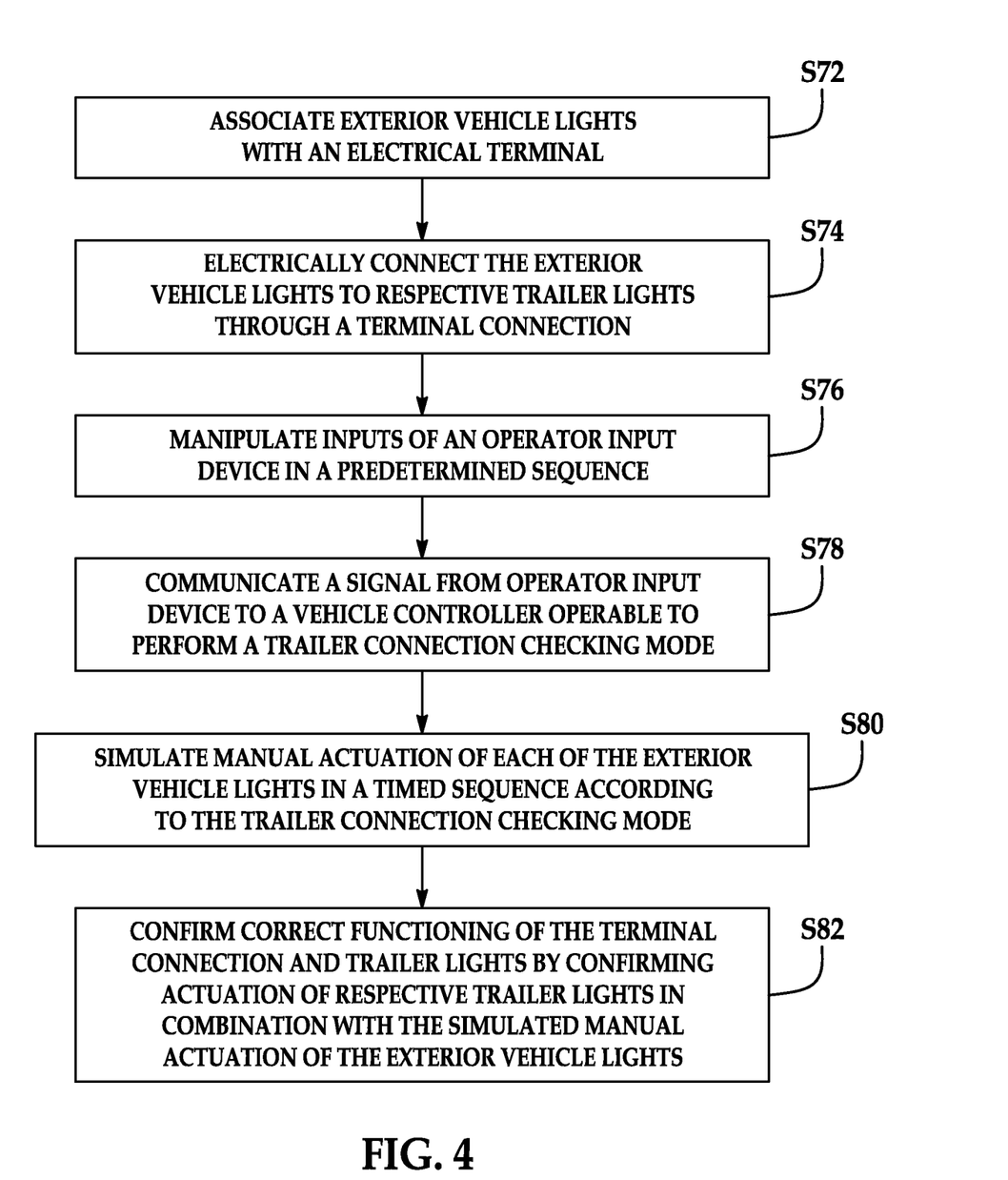
FIG. 4 is a flow diagram illustrating a method for checking an electrical connection between the vehicle and the trailer.

As shown in FIG. 4, in order to facilitate checking of the terminal connection 36, the vehicle controller 28 can simulate the manual actuation of the exterior vehicle lights 18 with the lighting control system 34 in accordance with a trailer connection checking mode. According to the illustrated process, in step S72, some or all of the exterior vehicle lights 18 of the vehicle 10 are associated with respective electrical terminals, for example the terminals 56, 60 described above. In step S74, the exterior vehicle lights 18 are electrically connected to respective corresponding trailer lights 20 though a terminal connection 36, such as the electrical connector 50. Then, in steps S76 and S78, an operator input device 14 can be manipulated to cause a signal to be communicated to a controller, such as the vehicle controller 28 including the lighting control system 34, to perform a trailer connection checking mode.

Referring back to FIG. 2A, an operator input device 14 can be communicatively coupled to the vehicle controller 28 including the lighting control system 34, and the vehicle controller 28 can be responsive to the operator input device 14 to initiate the trailer connection checking mode with the lighting control system 34. Any of a variety of operator input devices 14 can be used for this purpose, such as a button included in the instrument panel 22 or otherwise within the interior of the vehicle 10, or a button included on the exterior of the vehicle 10 located, for example, adjacent the electrical connector 50 first end 52. The operator input device 14 can also be a communication device positionable outside of the vehicle 10. For example, in FIG. 1, the operator input device is illustrated as a key fob 14, which may already be a standard accessory to the vehicle 10. The operator input device 14 may have a plurality of standard inputs 16 for standard communication with the vehicle 10. An additional input 16 could be added to the key fob 14 for communicating a signal to the vehicle controller 28 to perform a trailer connection checking mode with the lighting control system 34, or, a standard key fob 14 could be configured to communicate such a signal upon the manipulation of the inputs 16 in a predetermined sequence. For example, two or more inputs 16 could be manipulated in succession, two or more inputs 16 could be manipulated in unison, or the inputs 16 could be manipulated in any other manner. The vehicle 10 can have more than one operator input device 14. For example, the vehicle 10 can be provided with a key fob 14 configured for communication with the vehicle controller 28 to initiate the trailer connection checking mode with the lighting control system 34, and can also be provided with a button for initiating the trailer connection checking mode.

Referring again to FIG. 4, in step S80, the vehicle controller 28 simulates manual actuation of the exterior vehicle lights 18 with the lighting control system 34 in a timed sequence according to the trailer connection checking mode. The simulated manual actuation of the exterior vehicle lights 18 directly or indirectly causes the actuation of a respective corresponding trailer light 20, in the same way that manual actuation of the exterior vehicle lights 18 directly or indirectly causes the actuation of a respective corresponding trailer light 20. For example, in the illustrated implementation of a terminal connection 36, the vehicle controller 28 including the lighting control system 34 can cause an electrical power to be supplied to the terminals 56, 60 of the electrical connector 50 by actuating the exterior vehicle lights 18.

When the exterior vehicle lights 18 are actuated, the electrical power is simultaneously supplied to the terminals 58, 62 of a coupled second end 54, thereby causing respective corresponding trailer lights 20 to actuate. However, in other implementations of a terminal connection 36, manual actuation of the exterior vehicle lights 18 can be simulated by sending electrical power and/or appropriate control signals to a terminal connection 36 in order to cause actuation of the trailer lights 20. If the terminal connection 36 is configured to provide a non-direct connection between an exterior vehicle light 18 and a respective corresponding trailer light 20, each simulated actuation of an exterior vehicle light 18 can be performed in combination with an actual actuation of the exterior vehicle light 18, so as to provide a visual indication to a person checking the terminal connection 36 of which manual actuation is being simulated.

Finally, in step S82, correct functioning of the terminal connection 36 and trailer lights 20 is performed. Because the vehicle controller 28 including the lighting control system 34 is responsive to the operator input device 14, a person causing the operator input device 14 to communicate a signal to the vehicle controller 28 to initiate the trailer connection checking mode with the lighting control system 34 can also check the terminal connection 36. As shown, this procedure includes confirming actuation of the trailer lights 20 in combination with the simulated manual actuation of the respective corresponding exterior vehicle lights 18.

In the trailer connection checking mode, vehicle controller 28 can simulate manual actuation of each of the exterior vehicle lights 18 with the lighting control system 34, so that actuation of each possible respective corresponding trailer light 20 can be confirmed. Additionally, manual actuation of each of the exterior vehicle lights 18 can be simulated in a timed sequence over a predetermined period of time, for example, a period of time corresponding to an amount of time required to travel around the trailer 12 to confirm proper operation of each of the trailer lights 20.

Figure 5:
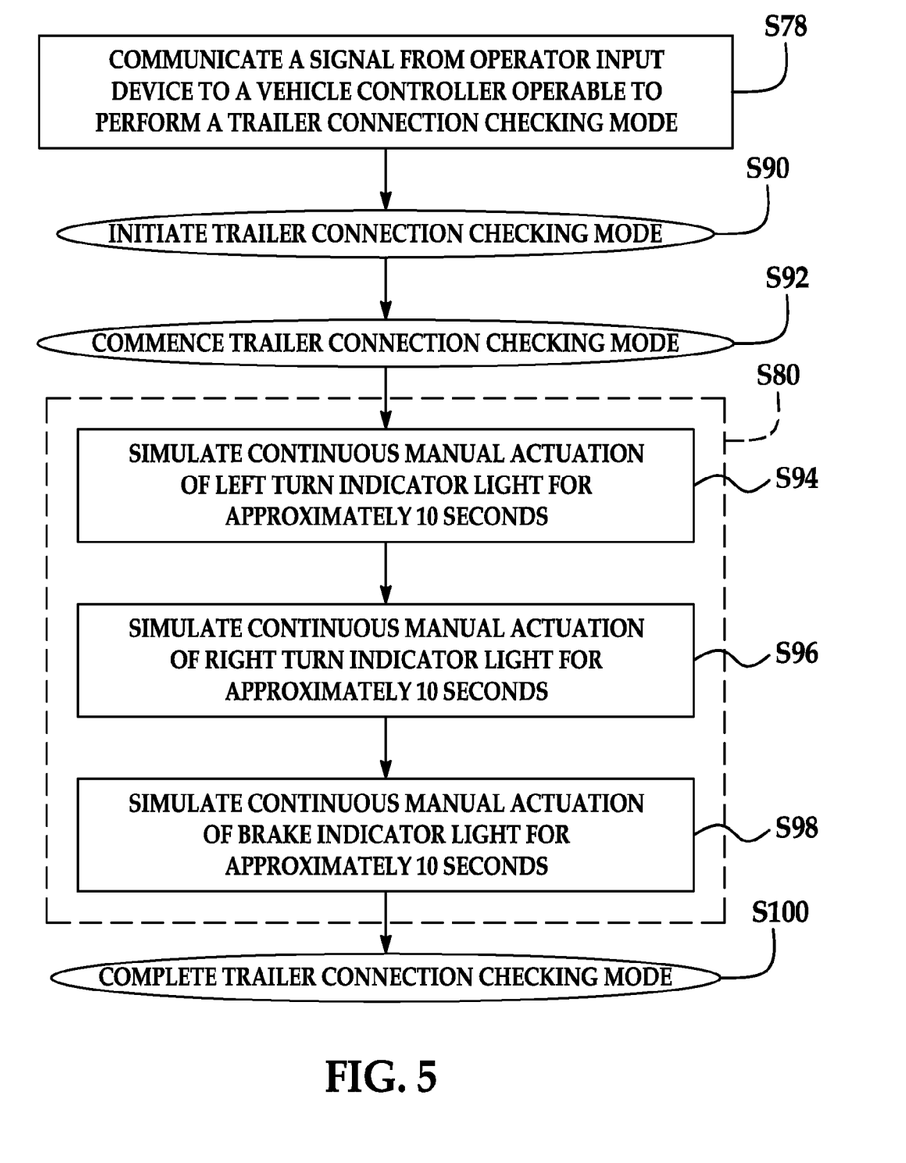
FIG. 5 is a flow diagram illustrating an implementation of a method for initiating and performing a trailer connection checking mode with the vehicle controller.

One exemplary implementation of the trailer connection checking mode is illustrated in FIG. 5. In step S78, an operator input device 14 communicates a signal to the vehicle controller 28 to perform a trailer connection checking mode with the lighting control system 34. The vehicle controller 28 is responsive to the operator input device 14 to initiate the trailer connection checking mode with the lighting control system 34 in step S90, and the vehicle controller 28 commences the trailer connection checking mode with the lighting control system 34 in step S92. In step S80, the vehicle controller 28 simulates manual actuation of the exterior vehicle lights 18 with the lighting control system 34 in a timed sequence according to the trailer connection checking mode. In the implementation of the trailer connection checking mode illustrated in FIG. 5, the exterior vehicle lights 18 include a left turn indicator light, a right turn indicator light and a brake indicator light. Step S80 includes sub-steps S94, S96 and S98, in which the vehicle controller 28 simulates the manual actuation of each of the exterior vehicle lights 18.

The manual actuations of each of the exterior vehicle lights 18 can be simulated in such a manner as to permit ease of confirmation of the proper operation of each of respective corresponding trailer lights 20. For example, a continuous manual actuation of each the exterior vehicle lights 18 can be simulated. The continuous manual actuation of each the exterior vehicle lights 18 can additionally be simulated for a predetermined time interval within the predetermined period of time required to travel around the trailer 12 to confirm proper operation of each of the trailer lights 20. For example, according to the implementation of the trailer connection checking mode illustrated in FIG. 5, the vehicle controller 28 simulates continuous manual actuation of the left turn indicator light for approximately 10 seconds in step S94, simulates continuous manual actuation of the right turn indicator light for approximately 10 seconds in step S96 and simulates continuous manual actuation of the brake indicator light for approximately 10 seconds in step S98. Although the continuous manual actuation of each of the exterior vehicle lights 18 is described as being simulated for a predetermined time interval of approximately 10 seconds, the predetermined time interval could be different from approximately 10 seconds, and can vary between different exterior vehicle lights 18, depending, for instance on the configuration of the vehicle 10 and/or the configuration of the trailer 12. In addition, both the predetermined time interval and the predetermined period of time could be fixed, or, for example, could be adjustable by an operator of the vehicle 10. In step S100, the trailer connection checking mode is completed by the vehicle controller 28.

Figure 6:
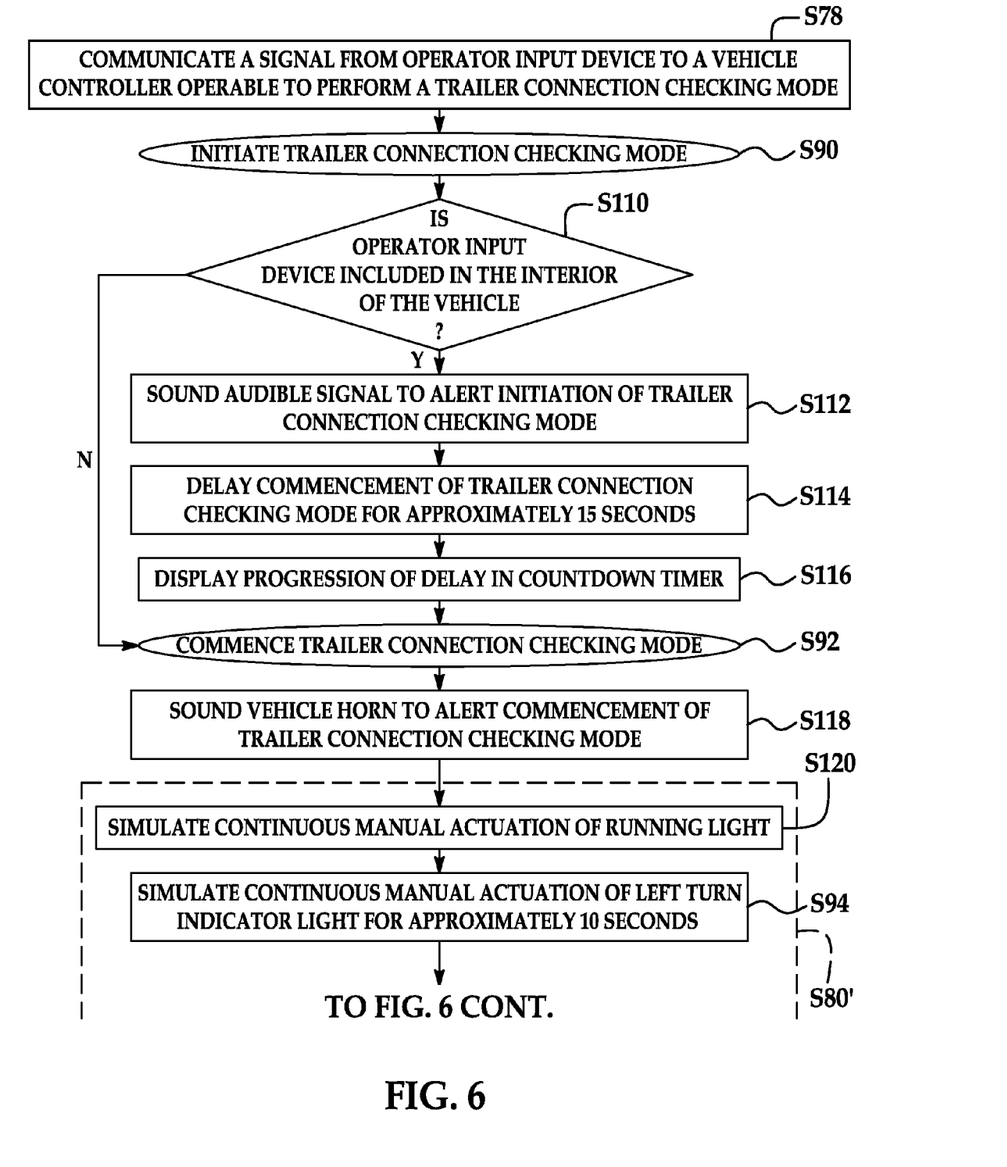
FIG. 6 is a flow diagram illustrating an alternative implementation of a method for initiating and performing a trailer connection checking mode with the vehicle controller.

An alternative implementation of the trailer connection checking mode is illustrated in FIG. 6. In step S78, an operator input device 14 communicates a signal to the vehicle controller 28 to perform a trailer connection checking mode with the lighting control system 34. The vehicle controller 28 is responsive to the operator input device 14 to initiate the trailer connection checking mode with the lighting control system 34 in step S90. The vehicle controller 28 is further responsive to the operator input device 14 to control other aspects of the vehicle 10, including operation of the components instrument panel 22 and the vehicle horn 24, for example, in combination with the initiation and performance of the trailer connection checking mode with the lighting control system 34.

In step S110, the vehicle controller 28 determines whether the operator input device 14 is included within the interior of the vehicle 10. If the vehicle controller 28 determines that the operator input device 14 is not included within the interior of the vehicle 10, the vehicle controller 28 proceeds to step S92. However, when the trailer connection checking mode is initiated by an operator input device 14 included within the interior of the vehicle 10, the controller 28 sounds an audible signal to alert the initiation of the trailer connection checking mode in step S112. The audible signal can be generated with various components known to those skilled in the art, and such components can be housed within the instrument panel 22 or otherwise within the interior of the vehicle 10. Although the signal in the illustrated implementation of the trailer connection checking mode is an audible signal, the signal could alternatively be a visual signal or an audiovisual signal, for example.

In step S114, the vehicle controller 28 delays commencement of the trailer connection checking mode. The delay is configured to permit an operator of the vehicle 10 who manipulates the operator input device 14 from within the interior of the vehicle 10 to exit the vehicle 10 and move into a suitable position outside of the vehicle 10 to confirm proper operation of each of the trailer lights 20 during performance of the trailer connection checking mode by the lighting control system 34. The illustrated delay is approximately 15 seconds, although the delay could vary depending, for instance, on the configuration of the vehicle 10 and/or the configuration of the trailer 12. In addition, the delay could be fixed, or, for example, could be adjustable by an operator of the vehicle 10. As shown in step S116, the progression of delay can be displayed to an operator of the vehicle 10. The delay could be displayed in a countdown timer or in other displays known to those skilled in the art. A display for displaying the delay could be housed within the instrument panel 22 or otherwise within the interior of the vehicle 10, or could alternatively or additionally be included in the exterior of the vehicle 10.

In step S92, the vehicle controller 28 commences the trailer connection checking mode with the lighting control system 34. In step S118, the controller 28 sounds an audible signal to alert the commencement of the trailer connection checking mode. The audible signal is illustrated as being generated by the vehicle horn 24, but for example could be generated by other components known to those skilled in the art. In addition, although the signal is illustrated as an audible signal, the signal could alternatively be a visual signal or an audiovisual signal perceivable from outside the vehicle 10.

In step S80', the vehicle controller 28 simulates manual actuation of the exterior vehicle lights 18 with the lighting control system 34 in a timed sequence according to the trailer connection checking mode. In the implementation the trailer connection checking mode illustrated in FIG. 6, the exterior vehicle lights 18 include a left turn indicator light, a right turn indicator light, a brake indicator light and a running light.

Similar to step S80 in the implementation of the trailer connection checking mode illustrated in FIG. 5, in step S80' the manual actuations of each of the exterior vehicle lights 18 can be simulated in such a manner as to permit ease of confirmation of the proper operation of each of respective corresponding trailer lights 20. For example, a continuous manual actuation of each the exterior vehicle lights 18 can be simulated. The continuous manual actuation of each the exterior vehicle lights 18 can additionally be simulated for a predetermined time interval within the predetermined period of time required to travel around the trailer 12 to confirm proper operation of each of the trailer lights 20. For example, according to the implementation of the trailer connection checking mode illustrated in FIG. 5, the vehicle controller 28 simulates continuous manual actuation of the running light in step S120, and the continuous manual actuation of the running light in step S120 is sustained until completion of the trailer connection checking mode. The vehicle controller 28 simulates continuous manual actuation of the left turn indicator light for approximately 10 seconds in step S94, and simulates continuous manual actuation of the right turn indicator light for approximately 10 seconds in step S96. In step S122, the vehicle controller 28 can simultaneously simulate continuous manual actuation of both the left turn indicator light and the right turn indicator light according to a hazard sequence for approximately 10 seconds. In step S98, the vehicle controller 28 simulates continuous manual actuation of the brake indicator light for approximately 10 seconds. Although the continuous manual actuation of each of the exterior vehicle lights 18 is described as being simulated for a predetermined time interval of approximately 10 seconds, the predetermined time interval could be different from approximately 10 seconds, and can vary between different exterior vehicle lights 18, depending, for instance on the configuration of the vehicle 10 and/or the configuration of the trailer 12. In addition, both the predetermined time interval and the predetermined period of time could be fixed, or, for example, could be adjustable by an operator of the vehicle 10.

In step S100, the trailer connection checking mode is completed by the vehicle controller 28. In step S124, the vehicle controller 28 again sounds an audible signal to alert the completion of the trailer connection checking mode. The audible signal can be the same or similar to the audible signal sounded in step S118. The audible signal is illustrated as being generated by the vehicle horn 24, but for example could be generated by other components known to those skilled in the art. In addition, although the signal is illustrated as an audible signal, the signal could alternatively be a visual signal or an audiovisual signal perceivable from outside the vehicle 10.

The simulated manual actuations of exterior vehicle lights 18 other than those described in the implementations of the trailer connection checking mode illustrated in FIGS. 5 and 6 could also be performed, depending upon the configuration of the vehicle 10 and/or the configuration of the trailer 12. The simulated manual actuations of the exterior vehicle lights 18 are generally shown in the non-limiting examples of FIGS. 5 and 6 as being performed sequentially, although the simulated manual actuations of the exterior vehicle lights 18 could also be performed simultaneously, in a partially overlapping manner and/or according to other patterns to assist in a visual confirmation of the actuation of respective corresponding trailer lights 20. Further, the respective ordering of the simulated manual actuations between each of the exterior vehicle lights 18 could be altered without departing from the illustrated implementations of the trailer connection checking mode.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A lighting system for a vehicle, comprising:
   a plurality of exterior vehicle lights, the exterior vehicle lights including a left turn indicator light, a right turn indicator light and a brake indicator light;
   the first of two ends of a terminal connection configured to electrically connect each of the plurality of exterior vehicle lights to a respective trailer light; and
   a vehicle controller programmed to have a normal mode wherein each of the plurality of exterior lights is subject to manual actuation by an operator, and a trailer connection checking mode wherein manual actuation of each of the plurality of exterior vehicle lights is simulated at the first end of the terminal connection, without requiring manual actuation of each of the plurality of exterior vehicle lights, according to a predetermined timed sequence, such that a respective trailer light will actuate in combination with the simulated manual actuation of each of the plurality of exterior vehicle lights if the terminal connection and the respective trailer light are functioning correctly.

2. The lighting system of claim 1, wherein the vehicle controller is programmed to simulate continuous manual actuation of each of the plurality of exterior vehicle lights for approximately 10 seconds in the trailer connection checking mode.

3. The lighting system of claim 2, wherein:
   the plurality of exterior vehicle lights includes a running light; and
   the vehicle controller is programmed to simulate continuous manual actuation of the running light in the trailer connection checking mode.

4. The lighting system of claim 2, wherein the vehicle controller is programmed to simultaneously simulate continuous manual actuation of the left turn indicator and the right turn indicator light in the trailer connection checking mode.

5. The lighting system of claim 1, wherein the vehicle controller is programmed to successively simulate continuous manual actuation of each of the plurality of exterior vehicle lights for approximately 10 seconds in the trailer connection checking mode.

6. The lighting system of claim 5, wherein the vehicle controller is programmed to simulate continuous manual actuation of one of the left turn indicator light and the right turn indicator light for approximately 10 seconds, simulate continuous manual actuation of the other of the left turn indicator light and the right turn indicator light for approximately 10 seconds, and simulate continuous manual actuation of the brake indicator light for approximately 10 seconds in the trailer connection checking mode.

7. The lighting system of claim 1, wherein:
   the vehicle controller is communicatively coupled to an operator input device; and
   the vehicle controller is responsive to the operator input device to initiate and commence the trailer connection checking mode.

8. The lighting system of claim 7, wherein the vehicle controller is programmed to sound an audible signal to alert the commencement of the trailer connection checking mode.

9. The lighting system of claim 8, wherein:
   the operator input device is a remote positionable outside the vehicle; and the vehicle controller is programmed to sound a vehicle horn to alert the commencement of the trailer connection checking mode.

10. The lighting system of claim 7, wherein the vehicle controller is programmed to alert the initiation of the trailer connection checking mode.

11. The lighting system of claim 7, wherein:
the operator input device is included in an interior of the vehicle; and
the vehicle controller is programmed to sound an audible signal to alert the initiation of the trailer connection checking mode and thereafter delay the commencement of the trailer connection checking mode.

12. The lighting system of claim 11, wherein the vehicle controller is programmed to control a countdown timer to display a progression of the delay.

13. The lighting system of claim 7, wherein the vehicle controller is programmed to alert a completion of the trailer connection checking mode.

14. A method for checking an electrical terminal connection between a vehicle and a trailer, comprising:
in a vehicle including a plurality of vehicle lights subject to manual actuation by an operator and the first of two ends of a terminal connection configured to electrically connect each of the plurality of exterior vehicle lights to a respective trailer light, simulating manual actuation of each of the plurality of exterior vehicle lights at the first end of the terminal connection with a vehicle controller, without requiring manual actuation of each of the plurality of exterior vehicle lights, in a predetermined timed sequence according to a trailer connection checking mode, such that a respective trailer light will actuate in combination with the simulated manual actuation of each of the plurality of exterior vehicle lights if the terminal connection and the respective trailer light are functioning correctly.

15. The method of claim 14, wherein the plurality of vehicle lights includes a left turn indicator light, a right turn indicator light and a brake indicator light, the predetermined timed sequence comprising:
simulating continuous manual actuation of one of the left turn indicator light and the right turn indicator light for approximately 10 seconds;
simulating continuous manual actuation of the other of the left turn indicator light and the right turn indicator light for approximately 10 seconds; and
simulating continuous manual actuation of the brake indicator light for approximately 10 seconds.

16. The method of claim 14, wherein the plurality of vehicle lights includes running light, the predetermined timed sequence further comprising:
simulating continuous manual actuation of the running light.

17. The method of claim 14, wherein the plurality of vehicle lights includes a left turn indicator light, a right turn indicator light, a brake indicator light and a running light, the predetermined timed sequence comprising:
simulating continuous manual actuation of the running light; and
during the simulated continuous manual actuation of the running light, simulating continuous manual actuation of one of the left turn indicator light and the right turn indicator light for approximately 10 seconds, simulating continuous manual actuation of the other of the left turn indicator light and the right turn indicator light for approximately 10 seconds, and simulating continuous manual actuation of the brake indicator light for approximately 10 seconds.

18. The method of claim 17, wherein the continuous manual actuations of the left turn indicator light, the right turn indicator light and the brake indicator light are individually simulated in succession.

19. The method of claim 14, further comprising:
manipulating an operator input device to communicate a signal instructing the vehicle controller to initiate the trailer connection checking mode.

20. The method of claim 19, further comprising:
alerting a commencement of the trailer connection checking mode.

21. A lighting system for a vehicle, comprising:
a plurality of exterior vehicle lights, the exterior vehicle lights including a left turn indicator light, a right turn indicator light and a brake indicator light;
the first of two ends of a terminal connection configured to electrically connect each of the plurality of exterior vehicle lights to a respective trailer light; and
a vehicle controller programmed to have a normal mode wherein each of the plurality of exterior lights is subject to manual actuation by an operator, and a trailer connection checking mode wherein manual actuation of each of the plurality of exterior vehicle lights is simulated at the first end of the terminal connection, without requiring manual actuation of each of the plurality of exterior vehicle lights, according to a predetermined timed sequence, such that a respective trailer light will actuate in combination with the simulated manual actuation of each of the plurality of exterior vehicle lights if the terminal connection and the respective trailer light are functioning correctly;
wherein the vehicle controller is responsive to an operator input device to initiate and commence the trailer connection checking mode, and is programmed to sound an audible signal to alert the initiation of the trailer connection checking mode and thereafter delay the commencement of the trailer connection checking mode.

* * * * *